United States Patent
Yang et al.

(12) 
(10) Patent No.: US 8,692,203 B1
(45) Date of Patent: Apr. 8, 2014

(54) IODIDE SCINTILLATOR FOR RADIATION DETECTION

(75) Inventors: Kan Yang, Knoxville, TN (US); Mariya Zhuravleva, Knoxville, TN (US); Charles L. Melcher, Oak Ridge, TN (US); Piotr Szupryczynski, Knoxville, TN (US)

(73) Assignees: Siemens Medical Solutions USA, Inc., Malvern, PA (US); University of Tennessee Research Foundation, Knoxville, TN (US)

( * ) Notice: Subject to any disclaimer, the term of this patent is extended or adjusted under 35 U.S.C. 154(b) by 578 days.

(21) Appl. No.: 13/098,654

(22) Filed: May 2, 2011

Related U.S. Application Data

(60) Provisional application No. 61/332,945, filed on May 10, 2010.

(51) Int. Cl.
*G01T 1/10* (2006.01)
*G01T 1/20* (2006.01)

(52) U.S. Cl.
CPC .................. *G01T 1/20* (2013.01)
USPC .................................... 250/361 R

(58) Field of Classification Search
CPC ............ G01T 1/20; G01T 1/2018; G01T 3/06
USPC ..................... 250/361 R, 370.01–370.15
See application file for complete search history.

(56) References Cited

U.S. PATENT DOCUMENTS

| | | | |
|---|---|---|---|
| 4,740,699 A * | 4/1988 | Miura et al. ................ | 250/586 |
| 6,369,391 B1 | 4/2002 | Hefetz et al. | |
| 2005/0061992 A1 * | 3/2005 | Kasai et al. ................ | 250/484.4 |
| 2005/0072937 A1 * | 4/2005 | Kondo et al. .............. | 250/484.4 |
| 2012/0001282 A1 * | 1/2012 | Goto et al. .................... | 257/429 |

FOREIGN PATENT DOCUMENTS

EP 2060614 A2 * 5/2009 ............ C09K 11/77

OTHER PUBLICATIONS

Extended EPSearch Report dated Jan. 4, 2012 in EP Patent Application EP11165494.

Zhuraleva, et al., "Crystal growth and scintillation properties of Cs3CeX6 and CsCe2X7 (X= Cl, Br)," Nuclear Science Symposium Conference Record (NSS/MIC), 2010 IEEE , vol., no., pp. 1296-1299, Oct. 30, 2010-Nov. 6, 2010.

Rooh, et al., "The growth and characterization of the cerium contained inorganic halide scintillators" Database Compendex [Online] Engineering Information, XP-002666180, Database accession No. E2010331314, 8249, abstract, Key Engineering Materials [Key Eng Mater]. vol. 442, pp. 275-282, 2010.

(Continued)

*Primary Examiner* — Kiho Kim
(74) *Attorney, Agent, or Firm* — Peter Kendall

(57) ABSTRACT

The present disclosure discloses, in one arrangement, a single crystalline iodide scintillator material having a composition of the formula $AM_{1-x}Eu_xI_3$, $A_3M_{1-x}Eu_xI_5$ and $AM_{2(1-x)}Eu_{2x}I_5$, wherein A consists essentially of any alkali metal element (such as Li, Na K, Rb, Cs) or any combination thereof, M consists essentially of Sr, Ca, Ba or any combination thereof, and $0 \leq x \leq 1$. In another arrangement, the above single crystalline iodide scintillator material can be made by first synthesizing a compound of the above composition and then forming a single crystal from the synthesized compound by, for example, the Vertical Gradient Freeze method. Applications of the iodide scintillator materials include radiation detectors and their use in medical and security imaging.

14 Claims, 9 Drawing Sheets

(56) References Cited

OTHER PUBLICATIONS

Rycerz, et al., "Phase diagram and electrical conductivity of the CeBr3-CsBr binary system", J. Therm Anal Calorim (2009) 97:1015-1021.
Glodo, et al; "Cs2LiYCl6 : Ce Scintillator for Nuclear Monitoring Applications", IEEE Transactions on Nuclear Science, vol. 56, No. 3, Jun. 1, 2009, pp. 1257-1261.
Hawrami, R, et al., "Advanced Scintillator Materials for Nuclear Radiation Detection", Alabama A&M University Science, Technology, Engineering & Mathematics Day, Apr. 11, 2008, pp. 55-56.
Bessiere, et al, "Scintillation and Anomalous Emission in Elpasolite Cs2LiLuCl6:Ce3+", Journal of Luminescence 117 (2006) pp. 187-198.
Belikov, K.N., "Analytical Control of Ce Content in CsCexGd2-xCl7 Single Crystals by Inductively Coupled Plasma Atomic Emission Spectrometry", Abstract, retrieved form STN database accession No. 2009:60516, XP002643847, 2008.
Rooh, et al., "The Growth and Scintillation Properties of CsCe2Cl7 Crystal", Journal of Crystal Growth 311 (2008), pp. 128-131.
Meyer, G., "The Reduction of Rare-Earth Metal Halides with Unlike Metals—Woehler's Metallothermic Reduction", Z. Anorg. Allg. Chem., vol. 633, Jan. 1, 2007, pp. 2537-2552.
Karbowiak, M, et al, "Energy Transfer and Upconversion of Nd3+ doped RbY2Cl7", Journal of Luminescence 104 (2003) pp. 197-205.
EP Search Report in Application No. 11165489.3 dated Jul. 11, 2011.
Knoll Glenn F.; "Radiation Detection and Measurement"; General Properties of Radiation Detectors, pp. 95-103; New York (1979).
Higgins, et al, "Bridgman growth of LaBr3:Ce and LaCl3:Ce crystals for high-resolution gamma-ray spectrometers", J. Crystal Growth 287 (2006) 239-242.
Seifert, H.J., "Ternary chlorides of the trivalent early lanthanides: Phase diagrams, crystal structures and thermodynamic properties", J. Thermal Analysis and Calorimetry 67 (2002) 789-826.
Ma, et al, "Thermodynamic calculation of the GdCl3—Aci (A=Na,K,Rb,Cs) phase diagrams based on experimental data", Calphad, vol. 30, Issue 1, Mar. 2006, pp. 88-94.
Seifert, et al, "Structure and Stability of the Low-Temperature Modification of Compounds Cs3LnCl6 (Ln= La—Gd)", Journal of Solid State Chemistry, vol. 107, Issue 1, Nov. 1993, pp. 19-26.
Kapala, et al, "Modelling of the thermodynamic properties of the ABr—CeBr3 (A=Li—Cs) systems", Calphad, vol. 34, Issue 1, Mar. 2010, pp. 15-19.
Rycerz, et al, "Phase diagram and electrical conductivity of the CeBr3—CsBr binary system", J. Therm. Anal. Calorim. 97 (2009), pp. 1015-1021.
Kramer, et al, "Development and characterization of highly efficient new cerium doped rare earth halide scintillator materials", J. Mater. Chem., 2006, 16, pp. 2773-2780.
Cherepy, et al, "Strontium and barium iodide high light yield scintillators", Applied Physics Letters, vol. 92, (2008), (3 pages).
Xinhua, et al, "Fluorescence spectra of ARE2I5 and AREI3 in the solid state (A [identical to] K, Rb, Cs, Ti; RE [identical to] Sm, Eu)", Journal of Alloys and Compounds, vol. 180, Issues 1-2, Mar. 25, 1992, pp. 235-238.
Baopeng, et al, Synthesis and structure of AEuI3 (A[triple bond; length as m-dash]Rb, Cs) and AEu2I5 (A[triple bond; length as m-dash]K, Rb, Cs), Journal of Alloys and Compounds, vol. 181, Issues 1-2, Proceedings of the 19th Rare Earth Research Conference, Apr. 3, 1992, pp. 511-514.
Guangming, et al, "The study of CsI-EuI2 binary system", [J] Acta Chim. Sinica, 1995,V53(10): 947-951 (English abstract attached).
Partial Search Report dated Sep. 19, 2011 in EP Patent Application EP11165494.
Zhuraleva, et al., "Crystal Growth and Scintillation Properties of Cs3CeCl6 and CsCe2Cl7", Journal of Crystal Growth 318 (Mar. 1, 2011) pp. 809-812.
Lisek, et al., "High-temperature study of phase equilibria in the systems CsCl—LnCl3 (Cn=Ce, Nd) by Knudsen effusion mass spectrometry", Journal of Thermal Analysis and Calorimetry, vol. 55, (Feb. 1, 1999), pp. 627-637.

* cited by examiner

IODIDE SCINTILLATOR FOR RADIATION DETECTION

CROSS-REFERENCE TO RELATED APPLICATIONS

The present application claims the benefit of U.S. Provisional Application Ser. No. 61/332,945, filed May 10, 2010. The present application also relates to commonly assigned non-provisional U.S. Patent Application entitled "CHLORIDE SCINTILLATOR FOR RADIATION DETECTION", filed on the same day as the present application and claiming the benefit of U.S. Provisional Application Ser. No. 61/332,972, filed May 10, 2010 and non-provisional U.S. Patent Application entitled "HALIDE SCINTILLATOR FOR RADIATION DETECTION", filed on the same day as the present application and claiming the benefit of U.S. Provisional Application Ser. No. 61/332,934, filed May 10, 2010. All applications are incorporated herein by reference.

TECHNICAL FIELD

This disclosure relates to scintillator materials used for detecting ionizing radiation, such as X-rays, gamma rays and thermal neutron radiation and charged particles, in security, medical imaging, particle physics and other applications. This disclosure relates particularly to iodide scintillator materials. Certain arrangements also relate to specific compositions of such scintillator material, method of making the same and devices with such scintillator materials as components.

BACKGROUND

Scintillator materials, which emit light pulses in response to impinging radiation, such as X-rays, gamma rays and thermal neutron radiation and charged particles, are used in detectors that have a wide range of applications in medical imaging, particle physics, geological exploration, security and other related areas. Considerations in selecting scintillator materials typically include, but are not limited to, luminosity, decay time and emission wavelengths.

While a variety of scintillator materials have been made, there is a continuous need for superior scintillator materials.

SUMMARY OF THE DISCLOSURE

The present disclosure relates generally to iodide scintillator materials and method of making such scintillator materials. In one arrangement, an iodide scintillator material is single-crystalline and has a composition of one of the formulas $AM_{1-x}Eu_xI_3$, $A_3M_{1-x}Eu_xI_5$ and $AM_{2(1-x)}Eu_{2x}I_5$, wherein A consists essentially of any alkali metal element (such as Li, Na K, Rb, Cs) or any combination thereof, M consists essentially of Sr, Be or any combination thereof, and $0 \le x \le 1$. Scintillators of this type include single-crystals of $ASr_{1-x}Eu_xI_3$, $A_3Sr_{1-x}Eu_xI_5$ and $ASr_{2(1-x)}Eu_{2x}I_5$. More specific examples include single-crystalline $CsSr_{1-x}Eu_xI_3$, $Cs_3Sr_{1-x}Eu_xI_5$ and $CsSr_{2(1-x)}Eu_{2x}I_5$.

A further aspect of the present disclosure relates to a method of making chloride scintillator materials of the above-mentioned compositions. In one example, high-purity starting iodides (such as CsI, $SrI_2$, $EuI_2$ and rare-earth iodide(s)) are mixed and melted to synthesize a compound of the desired composition of the scintillator material. A single crystal of the scintillator material is then grown from the synthesized compound by the Bridgman method (or Vertical Gradient Freeze (VGF) method), in which a sealed ampoule containing the synthesized compound is transported from a hot zone to a cold zone through a controlled temperature gradient at a controlled speed to form a single-crystalline scintillator from molten synthesized compound.

Another aspect of the present disclosure relates to a method of using a detector comprising one of the scintillation materials described above for imaging.

DETAILED DESCRIPTION

I. Overview

Figure 1:
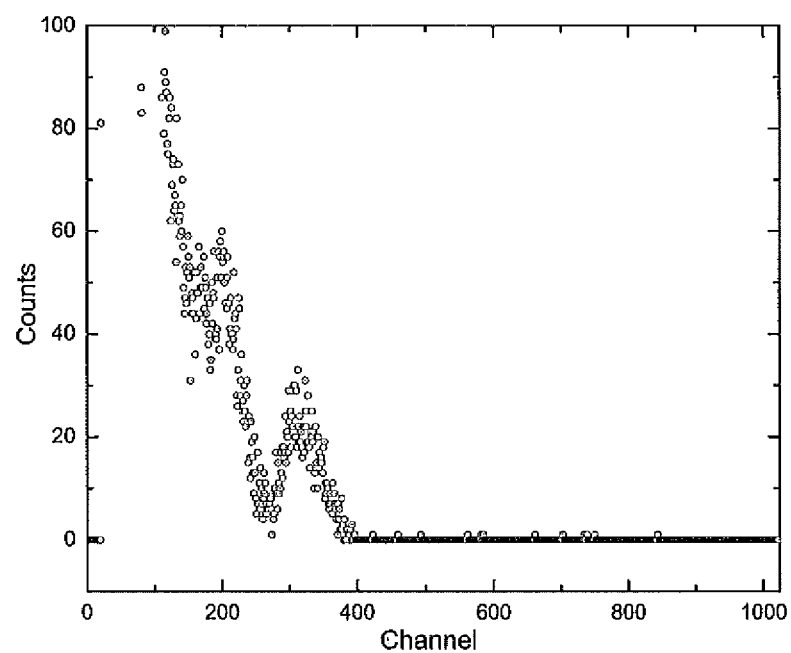
FIG. 1 shows an energy spectrum of a $CsSr_{1-x}Eu_xI_3$ crystal, with x=0.01 (normalized to BGO standard sample at channel no. 100); the spectrum was measured using $^{137}Cs$ gamma-ray source (662 keV).
Figure 2:
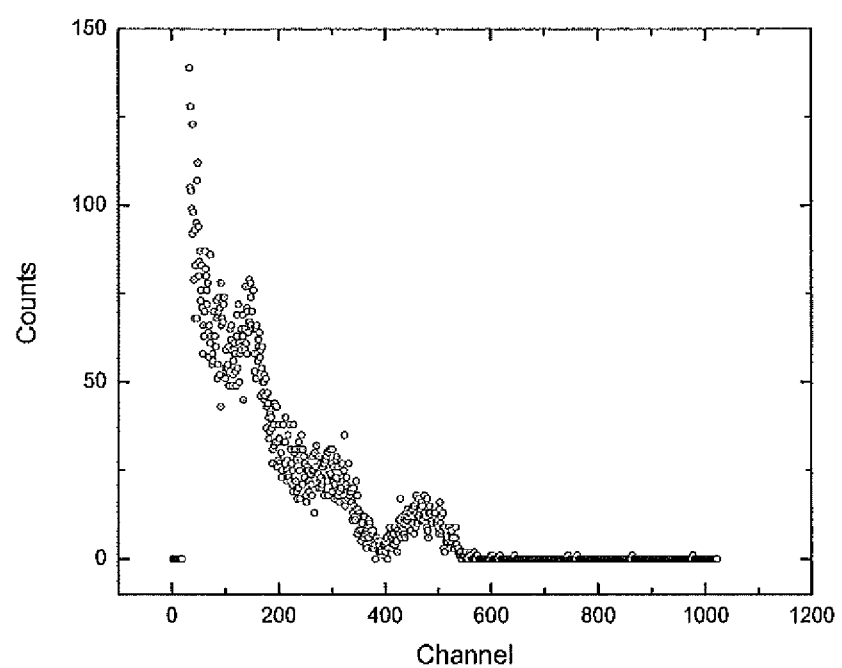
FIG. 2 shows an energy spectrum of a $CsSr_{1-x}Eu_xI_3$ crystal, with x=0.05, under the same conditions as for FIG. 1.
Figure 3:
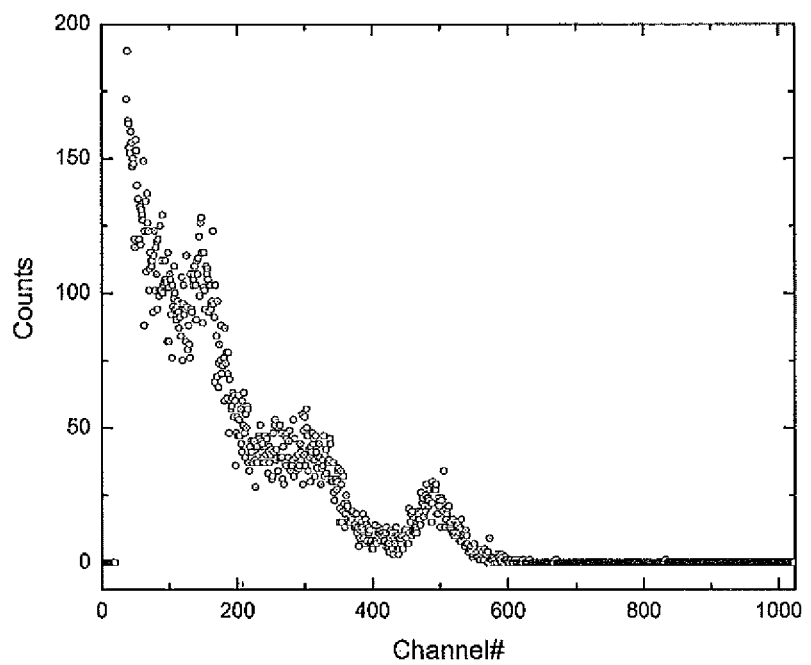
FIG. 3 shows an energy spectrum of a $CsSr_{1-x}Eu_xI_3$ crystal, with x=0.075, under the same conditions as for FIG. 1.
Figure 4:
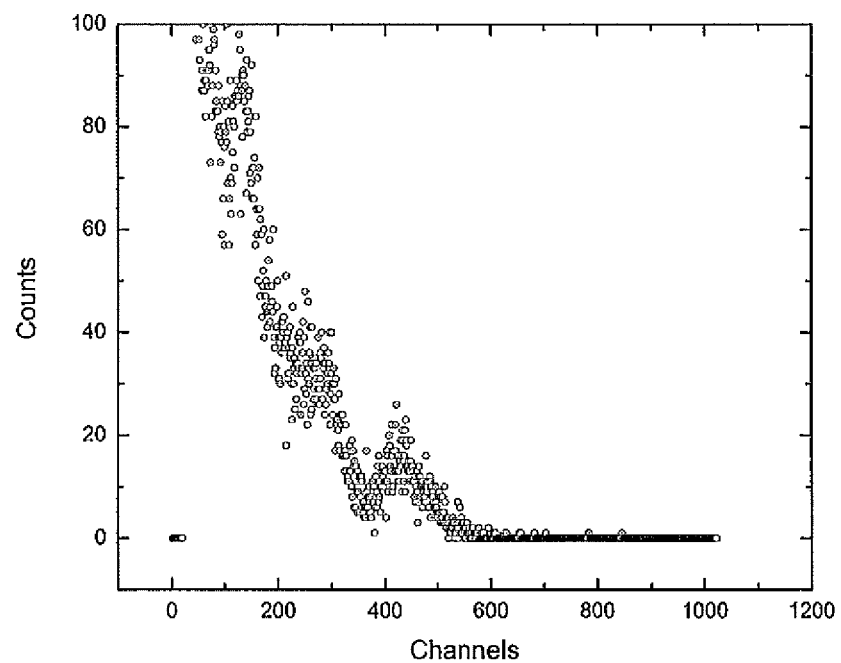
FIG. 4 shows an energy spectrum of a $CsSr_{1-x}Eu_xI_3$ crystal, with x=0.1, under the same conditions as for FIG. 1.

Inorganic scintillators are commonly used in nuclear and high-energy physics research, medical imaging, homeland security, and geological exploration. These materials typically possess sufficient stopping power for detection, high luminosity, high spectral energy resolution at room temperature and short decay time.

The viability of halide scintillators has been, and continues to be, investigated. For example, $LaBr_3$ doped with $Ce^{3+}$ is one of the best and most commonly used scintillators in security applications. As another example, $SrI_2$ doped with $Eu^{2+}$ exhibits a high light output of ~85,000 photons/MeV and ~4% energy resolution.

The present disclosure relates to halide scintillator materials and more particularly discloses new iodide single-crystal scintillators and method of making them. In one arrangement, an iodide scintillator material is single-crystalline and has a composition of the formula:

$$ASr_{1-x}Eu_xI_3,$$

$$A_3Sr_{1-x}Eu_xI_5 \text{ or}$$

$$ASr_{2(1-x)}Eu_{2x}I_5,$$

wherein A consists essentially of any alkali metal element (such as Li, Na K, Rb, Cs) or any combination thereof, and $0 \le x \le 1$. More specific examples include $CsSr_{1-x}Eu_xI_3$, $Cs_3Sr_{1-x}Eu_xI_5$ and $CsSr_{2(1-x)}Eu_{2x}I_5$.

A further aspect of the present disclosure relates to a method of making chloride scintillator materials of the above-mentioned compositions. In one example, high-purity starting iodides (such as CsI, SrI$_2$, EuI$_2$ and rare-earth iodide(s)) are mixed and melted to synthesize a compound of the desired composition of the scintillator material. A single crystal of the scintillator material is then grown from the synthesized compound by the Bridgman method (or Vertical Gradient Freeze (VGF) method), in which a sealed ampoule containing the synthesized compound is transported from a hot zone to a cold zone through a controlled temperature gradient at a controlled speed to form a single-crystalline scintillator from molten synthesized compound.

In another aspect of the present disclosure, the above-described scintillator materials are used in radiation detection by scintillation. For example, a radiation detector can include a scintillator described above for generating photons in response to the impinging radiation. The scintillator is optically coupled to a photon detector, such as a photomultiplier tube (PMT), arranged to receive the photons generated by the scintillator and adapted to generate a signal indicative of the photon generation. Such detectors can be used in applications such as imaging for security checking and medical diagnosis.

II. Example Configurations (a) Scintillator Crystal Growth

In one arrangement, iodide single-crystals described above were grown. First, CsI, SrI$_2$, EuI$_2$ and additional rare earth iodides were prepared and loaded into a quartz ampoule in a glove box with pure nitrogen atmosphere. The starting materials were all anhydrous beads with at least 99.99% purity (available, e.g., from Sigma-Aldrich). The loaded ampoule was then connected to a vacuum system. The ampoule was sealed by a hydrogen torch after the vacuum inside the quartz ampoules was evacuated to at least $1 \times 10^{-6}$ mBar. Vertical Gradient Freeze (VGF) technique was used to grow ASr$_{1-x}$Eu$_x$I$_3$, A$_3$Sr$_{1-x}$Eu$_x$I$_5$ and ASr$_{2(1-x)}$Eu$_{2x}$I$_5$ single crystals. The single crystals were grown in vacuum-sealed quartz ampoules of up to 1 inch diameter. A Mellen 24-zone Sunfire Electro-Dynamic Gradient furnace was used to create a vertically translating thermal gradient. The thermal gradient was electrically moved through the whole length of the crystal growth ampoule at a speed of 0.5-2 mm/hour (e.g., 1 mm/hour). Single crystal was grown from a capillary connected to the bottom of the ampoules. The capillary insures only one single crystal grain can propagate in to the ampoule body. After the growth was finished, the crystal was cooled down to room temperature at a rate of about 10° C./hour. The crystal was then cut, and ground and polished (as needed) in the glove box. Single crystals samples of about 10 mm across were obtained.

(b) Characterization of Scintillator Crystals

Certain samples were characterized without polishing while for certain others, plates of about 1-3 mm in thickness were cut from the boules and polished using a set of sand papers and mineral oil. To identify the obtained phase, powder X-ray diffraction (XRD) analysis was carried out in air at room temperature. To minimize the effects of self-absorption, small samples (typically 1-2 mm thick, 3 mm×3 mm) were selected for the optical characterization.

Scintillation time profiles were recorded using the time-correlated single photon technique and a $^{137}$Cs gamma-ray source. Radioluminescence spectra were measured at room temperature (RT) under continuous irradiation from an X-ray generator (operating, e.g., at 35 kV and 0.1 mA). Light output measurements were carried out on samples covered in mineral oil and directly coupled to a photomultiplier tube (PMT) and covered with Teflon tape. A Hamamatsu 3177-50 PMT was used for absolute light output measurements. Gamma-ray energy spectra were recorded using a $^{137}$Cs source with a 10 µs shaping time. The integral quantum efficiency of the PMT according to the emission spectrum of the scintillators was used to calculate the number of photons per unit gamma ray energy. The energy resolution, at 662 keV was determined from the full-width at half-maximum (FWHM) of the 662 keV photopeak.

(c) Example Results

According to certain aspects of the present disclosure, single crystals of the iodide materials suitable for scintillator applications were made, and their scintillation properties were measured and have demonstrated high performance under optical, X-ray, gamma ray excitations. These scintillators exhibit Eu$^{2+}$ 5d-4f luminescence.

FIGS. 1 to 4 shows the energy spectra for unpolished CsSr$_{(1-x)}$Eu$_x$I$_3$, where x=0.01, 0.05, 0.075 and 0.1, respectively. The channel numbers are proportional to the relative light output of the sample. The relative light output (photo peak position) of the reference crystal BGO is 100 on this scale. The light output of these samples was at least about 40,000 photons/MeV.

Figure 5:
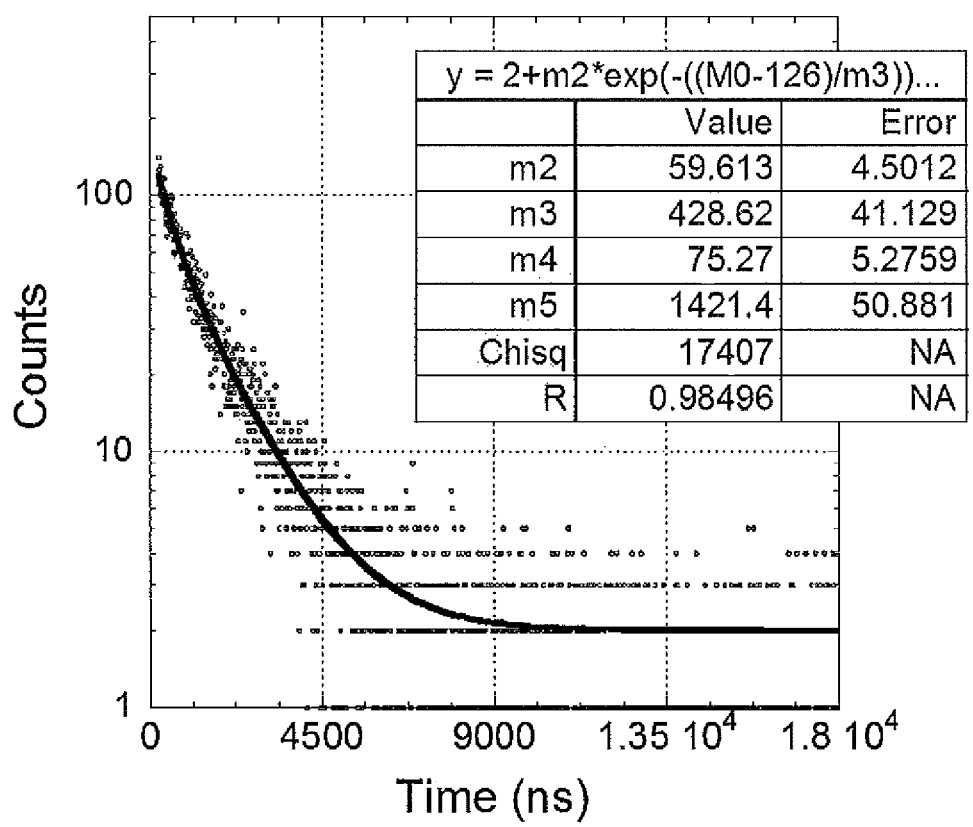
FIG. 5 shows a scintillation decay time spectrum of a $CsSr_{1-x}Eu_xI_3$ crystal, with x=0.01; the spectrum was measured using $^{137}Cs$ gamma-ray source (662 keV).
Figure 6:
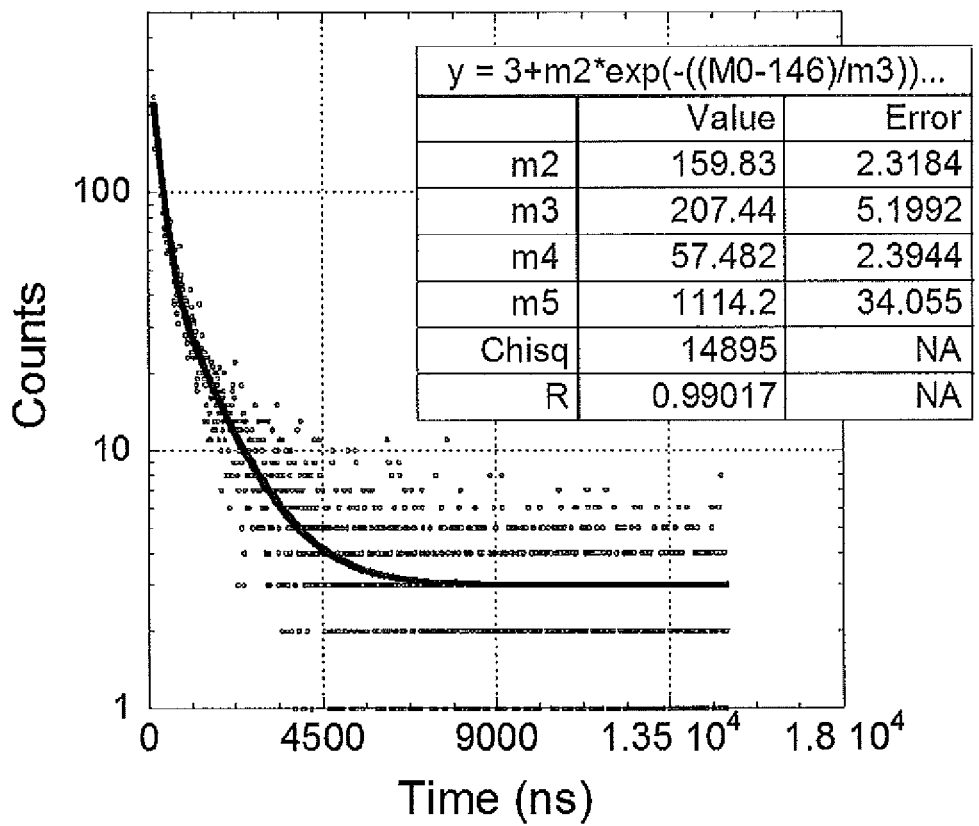
FIG. 6 shows a scintillation decay time spectrum of a $CsSr_{2(1-x)}Eu_{2x}I_5$ crystal, with x=0.01; the spectrum was measured using $^{137}Cs$ gamma-ray source (662 keV).

FIGS. 5 and 6 show the scintillation time profiles for unpolished CsSr$_{0.99}$Eu$_{0.01}$I$_3$ and CsSr$_{1.98}$Eu$_{0.02}$I$_5$ samples, respectively. Both profiles were measured by a $^{137}$Cs source. The scintillation decay times for CsSr$_{0.99}$Eu$_{0.01}$I$_3$ consist of two components: 429 ns for 20% and 1421 ns for 80%. The scintillation decay times for CsSr$_{1.98}$Eu$_{0.02}$I$_5$ are 207 ns for 35% and 1,114 ns for 65%.

Figure 7:
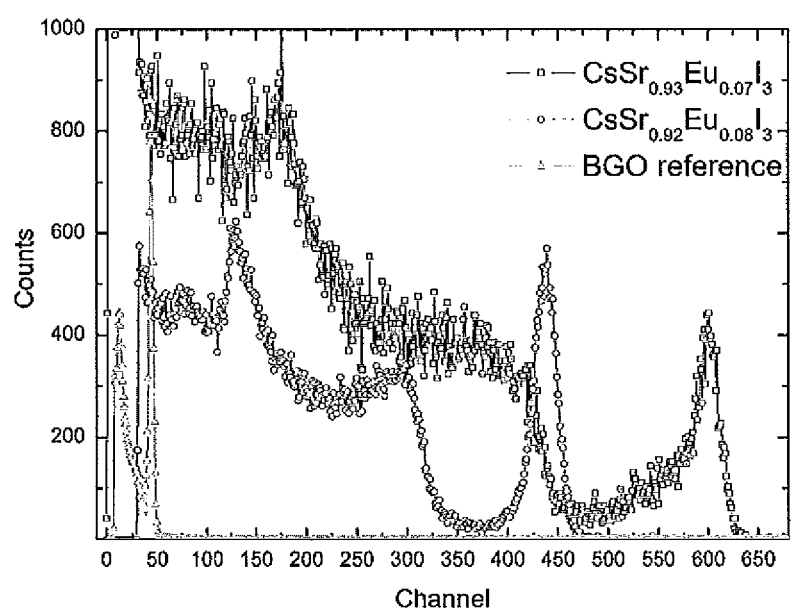
FIG. 7 shows energy spectra of two $CsSr_{1-x}Eu_xI_3$ crystals, with x=0.07 and 0.08, respectively, under the same conditions as for FIG. 1.

FIG. 7 shows energy spectra of two polished CsSr$_{1-x}$Eu$_x$I$_3$ crystals, with x=0.07 and 0.08, respectively, as compared to that of BGO. The absolute light yield is about twelve (12) times that of BGO for CsSr$_{0.93}$Eu$_{0.07}$I$_3$ and about eight (8) times that of BGO for CsSr$_{0.92}$Eu$_{0.08}$I$_3$.

Figure 8:
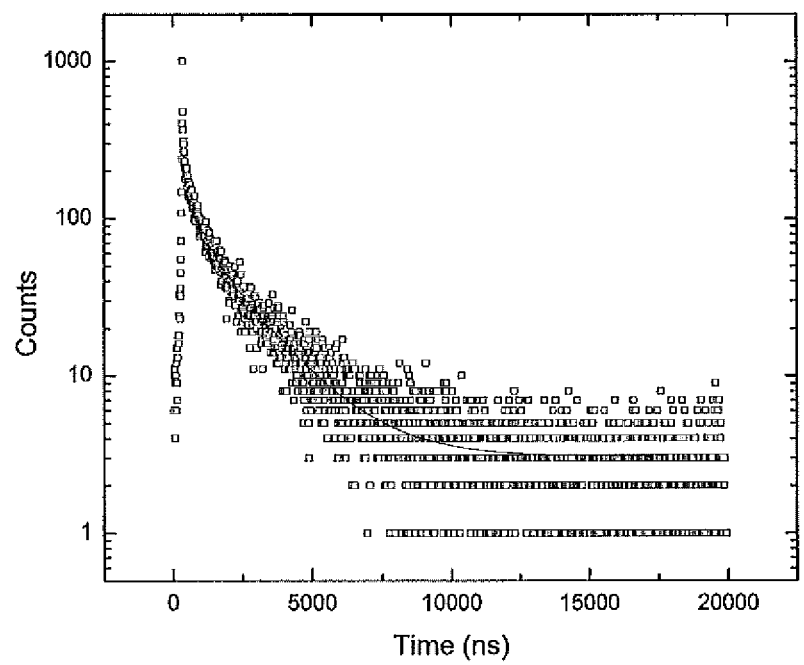
FIG. 8 shows a scintillation decay time spectrum of a $CsSr_{1-x}Eu_xI_3$ crystal, with x=0.01; the spectrum was measured using $^{137}Cs$ gamma-ray source (662 keV).

FIG. 8 shows a scintillation decay time spectrum of a polished CsSr$_{1-x}$Eu$_x$I$_3$ crystal, with x=0.01; the spectrum was measured using $^{137}$Cs gamma-ray source (662 keV). The decay spectrum was fitted to a single exponential curve, with a decay time of about 1.7 µs.

Figure 9:
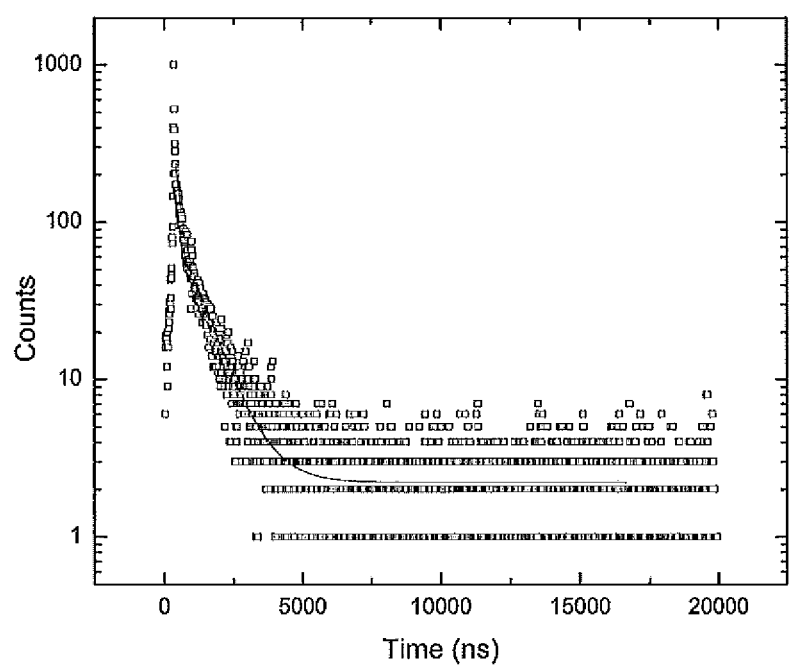
FIG. 9 shows a scintillation decay time spectrum of a $CsSr_{2(1-x)}Eu_{2x}I_5$ crystal, with x=0.01; the spectrum was measured using $^{137}Cs$ gamma-ray source (662 keV).

FIG. 9 shows a scintillation decay time spectrum of a polished CsSr$_{2(1-x)}$Eu$_{2x}$I$_3$ crystal, with x=0.01; the spectrum was measured using $^{137}$Cs gamma-ray source (662 keV).

In aspect of the present disclosure, certain properties of certain iodide scintillator crystals disclosed above were measured as a function of composition. For example, light yield, energy resolution and scintillation decay times were measured as a function of composition for single-crystalline CsSr$_{1-x}$Eu$_x$I$_3$ samples. The results are listed in Table I.

TABLE I

Summary of scintillation properties for CsSr$_{1-x}$Eu$_x$I$_3$

| Composition | light yield (ph/MeV) | energy resolution at 662 keV | Scintillation decay time (µs) |
|---|---|---|---|
| CsSr0.99Eu0.01I3 | 32000 | 9.0% | 1.7 |
| CsSr0.92Eu0.08I3 | 65000 | 5.9% | 3.3 |
| CsEuI3 | 24000 | 11.0% | 3.4 |

III. Summary

Thus, Eu-activated iodide scintillator crystals with excellent scintillation properties have been produced according to the present disclosure. Because many embodiments of the invention can be made without departing from the spirit and scope of the invention, the invention resides in the claims hereinafter appended.

We claim:

1. A scintillator material comprising a single crystal having a composition of the formula $$AM_{1-x}Eu_xI_3,$$

$$A_3M_{1-x}Eu_xI_5, \text{ or}$$

$$AM_{2(1-x)}Eu_{2x}I_5,$$

wherein:
A consists essentially of any alkali metal element or any combination thereof,
M consists essentially of Sr, Ca, Ba or any combination thereof, and
$0 \leq x \leq 1$.

2. The scintillator material of claim 1, the single crystal having a composition of formula $$ASr_{1-x}Eu_xI_3,$$

$$A_3Sr_{1-x}Eu_xI_5, \text{ or}$$

$$ASr_{2(1-x)}Eu_{2x}I_5.$$

3. The scintillator material of claim 2, the single crystal having a composition of formula $$CsSr_{1-x}Eu_xI_3,$$

$$Cs_3Sr_{1-x}Eu_xI_5, \text{ or}$$

$$CsSr_{2(1-x)}Eu_{2x}I_5.$$

4. The scintillator material of claim 3, having a light output of at least about four times that of BGO when excited with a gamma-ray of 662 keV.

5. The scintillator material of claim 4, having a light output of at least about eight times that of BGO when excited with a gamma-ray of 662 keV.

6. The scintillator material of claim 5, having a light output of at least about twelve times that of BGO when excited with a gamma-ray of 662 keV.

7. The scintillator material of claim 1, wherein x is less than or equal to, about 0.1.

8. A radiation detector, comprising:
a scintillator material of claim 1 adapted to generate photons in response to an impinging radiation; and
a photon detector optically coupled to the scintillator material, arranged to receive the photons generated by the scintillator material and adapted to generate an electrical signal indicative of the photon generation.

9. An imaging method, comprising:
using at least one radiation detector of claim 8 to receive radiation from a plurality of radiation sources distributed in an object to be imaged and generate a plurality of signals indicative of the received radiation; and
based on the plurality of signals, deriving a special distribution of an attribute of the object.

10. A method of making a scintillator material, the method comprising:
synthesizing a compound having a composition of the formula $$AM_{1-x}Eu_xI_3,$$

$$A_3M_{1-x}Eu_xI_5, \text{ or}$$

$$AM_{2(1-x)}Eu_{2x}I_5,$$

wherein:
A consists essentially of any alkali metal element or any combination thereof,
M consists essentially of Sr, Ca, Ba or any combination thereof, and
$0 \leq x \leq 1$;
growing a single crystal from the synthesized compound.

11. The method of claim 10, wherein the synthesizing step comprises synthesizing a compound having a formula of:

$$ASr_{1-x}Eu_xI_3,$$

$$A_3Sr_{1-x}Eu_xI_5, \text{ or}$$

$$ASr_{2(1-x)}Eu_{2x}I_5.$$

12. The method of claim 10, wherein growing a single crystal comprises growing a single crystal from the synthesized compound using a Vertical Gradient Freeze method.

13. The method of claim 10, wherein the synthesizing step comprises heating a mixture of a plurality of iodides above their respective melting temperatures.

14. The method of claim 13, wherein the synthesizing step comprises heating a mixture of CsI, $SrI_2$ and $EuI_2$ above their respective melting temperatures.

* * * * *